United States Patent

Mapps et al.

(10) Patent No.: US 7,564,239 B2
(45) Date of Patent: Jul. 21, 2009

(54) MAGNETIC FIELD DETECTOR AND A CURRENT MONITORING DEVICE INCLUDING SUCH A DETECTOR

(75) Inventors: Desmond James Mapps, Hartley (GB); Larissa V Panina, Plymouth (GB)

(73) Assignee: The University of Plymouth, Plymouth (GB)

( * ) Notice: Subject to any disclaimer, the term of this patent is extended or adjusted under 35 U.S.C. 154(b) by 0 days.

(21) Appl. No.: 10/470,808

(22) PCT Filed: Jan. 24, 2002

(86) PCT No.: PCT/GB02/00299

§ 371 (c)(1),
(2), (4) Date: Dec. 22, 2003

(87) PCT Pub. No.: WO02/061445

PCT Pub. Date: Aug. 8, 2002

(65) Prior Publication Data

US 2004/0075431 A1  Apr. 22, 2004

(30) Foreign Application Priority Data

Feb. 1, 2001  (GB) ................... 0102602.0

(51) Int. Cl.
*G01R 33/00* (2006.01)
*G01R 15/20* (2006.01)

(52) U.S. Cl. .................. 324/260; 324/117 R; 324/258; 324/263

(58) Field of Classification Search ............. 324/117 R, 324/117 H, 126, 127, 258, 260, 263, 267, 324/76.75, 244, 207.13, 261, 262
See application file for complete search history.

(56) References Cited

U.S. PATENT DOCUMENTS

| 2,922,110 | A | * | 1/1960 | Miller ........................ 324/115 |
| 4,963,827 | A | * | 10/1990 | Popovic et al. ............. 324/251 |
| 5,132,608 | A | * | 7/1992 | Nishifuji et al. ........... 324/99 R |
| 5,430,613 | A | * | 7/1995 | Hastings et al. ............. 361/760 |
| 5,523,677 | A | * | 6/1996 | Kawakami et al. ....... 324/117 R |
| 5,994,899 | A | * | 11/1999 | Mohri ........................ 324/260 |
| 6,028,427 | A | * | 2/2000 | Kawase ...................... 324/249 |
| 6,121,770 | A | * | 9/2000 | Sudo .......................... 324/244 |
| 6,392,401 | B1 | * | 5/2002 | Cooke ........................ 324/127 |
| 6,963,195 | B1 | * | 11/2005 | Berkcan .................. 324/117 R |

FOREIGN PATENT DOCUMENTS

| EP | 1037056 | A | * | 9/2000 |
| JP | 64-6767 | A | * | 1/1989 |
| JP | 64-18069 | A | * | 1/1989 |
| JP | 10232259 | A | * | 9/1998 |
| JP | 2000149223 | A | * | 5/2000 |
| SU | 1372406 | A | * | 2/1988 |
| WO | WO 02/061445 | A1 | | 8/2002 |

OTHER PUBLICATIONS

Translation of the Detailed Description of Konishi (JP10232259).*

* cited by examiner

*Primary Examiner*—Patrick J Assouad
*Assistant Examiner*—David M. Schindler
(74) *Attorney, Agent, or Firm*—Gardere Wynne Sewell, LLP

(57) ABSTRACT

A magnetic field detector is provided that makes use of Magneto-Impedance in order to switch an oscillator between operating states as a function of magnetic field strengths.

8 Claims, 7 Drawing Sheets

Equivalent Circuit

MAGNETIC FIELD DETECTOR AND A CURRENT MONITORING DEVICE INCLUDING SUCH A DETECTOR

CROSS REFERENCE TO RELATED APPLICATIONS

This application claims priority to International Application Number PCT/GB02/00299 filed Jan. 24, 2002, which claims the benefit of priority to Application Number 0102602.0 filed Feb. 1, 2001, in the United Kingdom.

BACKGROUND OF THE INVENTION

The present invention relates generally to the field of magnetic field detectors and devices, and more specifically to current monitoring devices or current leakage detection devices, including such detectors.

In accordance with the present invention, there is provided a magnetic field detector, comprising a sensor exhibiting an impedance that changes as a function of field strength at the sensor, the sensor comprising at least one wire arranged in a closed path, or a substantially closed path, which in use encircles at least one wire carrying a current, and a measurement device responsive to the impedance of the sensor, characterised in that the sensor is positioned on at least one magnetic element which forms a closed path, wherein said sensor is substantially insensitive to the position of the or each wire with respect to the sensor.

Preferably the sensor comprises material exhibiting giant magneto-impedance or asymmetrical giant magneto-impedance. Magneto-Impedance (MI) is an effect where the presence of a magnetic field causes the impedance of a material to vary. In this context impedance includes both the in-phase (resistive) component and the out of phase (reactive) component of impedance. A suitable sensor can be formed, for example, of cobalt iron silicon boron wire.

By providing a magnetic field detector in which the sensor is placed adjacent a magnetisable material or a material exhibiting relatively high magnetic permeability that forms a closed loop around one or more current carrying conductors, much improved sensor performance is achieved.

Consider the case of an infinitely long current carrying conductor. It is well known that the magnetic field falls of with distance r, as 1/r.

In testing, the inventors had noticed that movement of the current carrying wire(s) away from the axis of the sensor, when the sensor has a circular loop of magnetic wire, could cause variations in the measurements provided by the sensor. These systematic shifts due to changes in geometry need not be a problem if the geometry is, in use, known and static.

However, the magnetic ring of material removes this sensitivity to geometric offset. It is believed that this is because the flux density within the material of the ring must be uniform and, from application of Amperes law $\int B \cdot dl = \mu_0 I$. Thus the positioning of the wire passing through the loop becomes unimportant.

Advantageously two magnetic elements are provided with the sensor placed therebetween. In this configuration the magnetic material acts to shield the sensor from external or environmental fields whilst also making the sensor less sensitive to the positioning of the current carrying conductors.

SUMMARY OF THE INVENTION

The invention described herein is a magnetic field detector. The magnetic elements are advantageously in the form of a rings or cylinders. Advantageously the sensor may be provided in association with a biasing element so as to alter the response of the sensor. The biasing element may make the sensor more sensitive to a transition in magnetic field strength or may allow the affects of environmental fields to be nulled out. The biasing element may be a permanent magnet, or may be an electromagnet, for example a coil on or adjacent the sensor. Alternatively an AC bias may be provided, for example by a coil adjacent or over the sensor. The coil may be connected in series with the sensor.

In accordance with one aspect of the present invention, the measurement means is arranged to undergo a transition between operating states as a result of the magnetic field at the sensor changing from a first predetermined range of field strengths to a second predetermined range of field strengths. Advantageously the change is a sudden transition, giving rise to a switching action. Alternatively, the change may be more gradual.

In accordance with another aspect of the present invention, the sensor, in combination with the measurement means, forms a resonant circuit. As such, the resonant circuit may be part of an oscillator. The circuit may be arranged such that the sensor forms an inductor within the oscillator. The change in the reactive part of the inductor's impedance gives rise to a change in oscillation frequency. Furthermore, the oscillator may be arranged such that it will not sustain oscillation outside of a predetermined operating range. Thus, for example, if the "gain" of the oscillator is a function of frequency, the gain may be insufficient to sustain oscillation, or the amplitude of the oscillation may vary with the magnetic field strength at the sensor. A feature of disabling the oscillations may be brought about by the use of other components within the oscillator or may rely on the changes of the value of the resistive component of the sensor to dampen the oscillations.

In accordance with another aspect of the present invention, the field strength at the sensor may be determined from the oscillation frequency. Alternatively, the field strength may be determined from the magnitude of the oscillations, or the presence or absence of oscillations.

In accordance with yet another aspect of the present invention, the sensor may be an inductor in the form of a single or multiple turn loop. It is to be expected that the number of turns affects not only the oscillation frequency (since the number of turns affects the inductance of the inductor) but also the sensitivity of the sensor.

The sensor may be placed in the vicinity of a current carrying wire or wires so as to measure the current therein. Additionally and/or alternatively the difference between currents flowing in opposite directions in two or more wires may be measured. In this arrangement the opposing contributions to the magnetic field add. Thus if the currents are equal and opposite then there is no resultant magnetic effect. However, if there is a current difference then the opposing magnetic fields do not cancel out and there is a net magnetic field that may be detected by the sensor.

According to still another aspect of the present invention, there is provided a current measuring device, comprising a magnetic field sensor according to a first aspect of the present invention. The current measuring device may act as a component in a circuit breaker in order to prevent the current in a wire from exceeding a predetermined maximum. Alternatively, the device may be arranged to estimate the sum of the currents flowing in a plurality of wires.

As a further alternative, wires carrying currents in anti-phase may be monitored by the device, and an indication may be given when the difference between the currents exceeds a predetermined value.

Those skilled in the art will further appreciate the above-mentioned advantages and superior features of the invention, together with other important aspects thereof upon reading the detailed description that follows in conjunction with the drawings.

BRIEF DESCRIPTION OF THE SEVERAL VIEWS OF THE DRAWINGS

For a more complete understanding of the features and advantages of the present invention, reference is now made to the detailed description of the invention along with the accompanying FIGURES in which corresponding numerals in the different FIGURES refer to corresponding parts and in which.

DETAILED DESCRIPTION OF THE INVENTION

Although making and using various embodiments of the present invention are discussed in detail below, it should be appreciated that the present invention provides many inventive concepts that may be embodied in a wide variety of contexts. The specific aspects and embodiments discussed herein are merely illustrative of ways to make and use the invention, and do not limit the scope of the invention.

Figure 1:
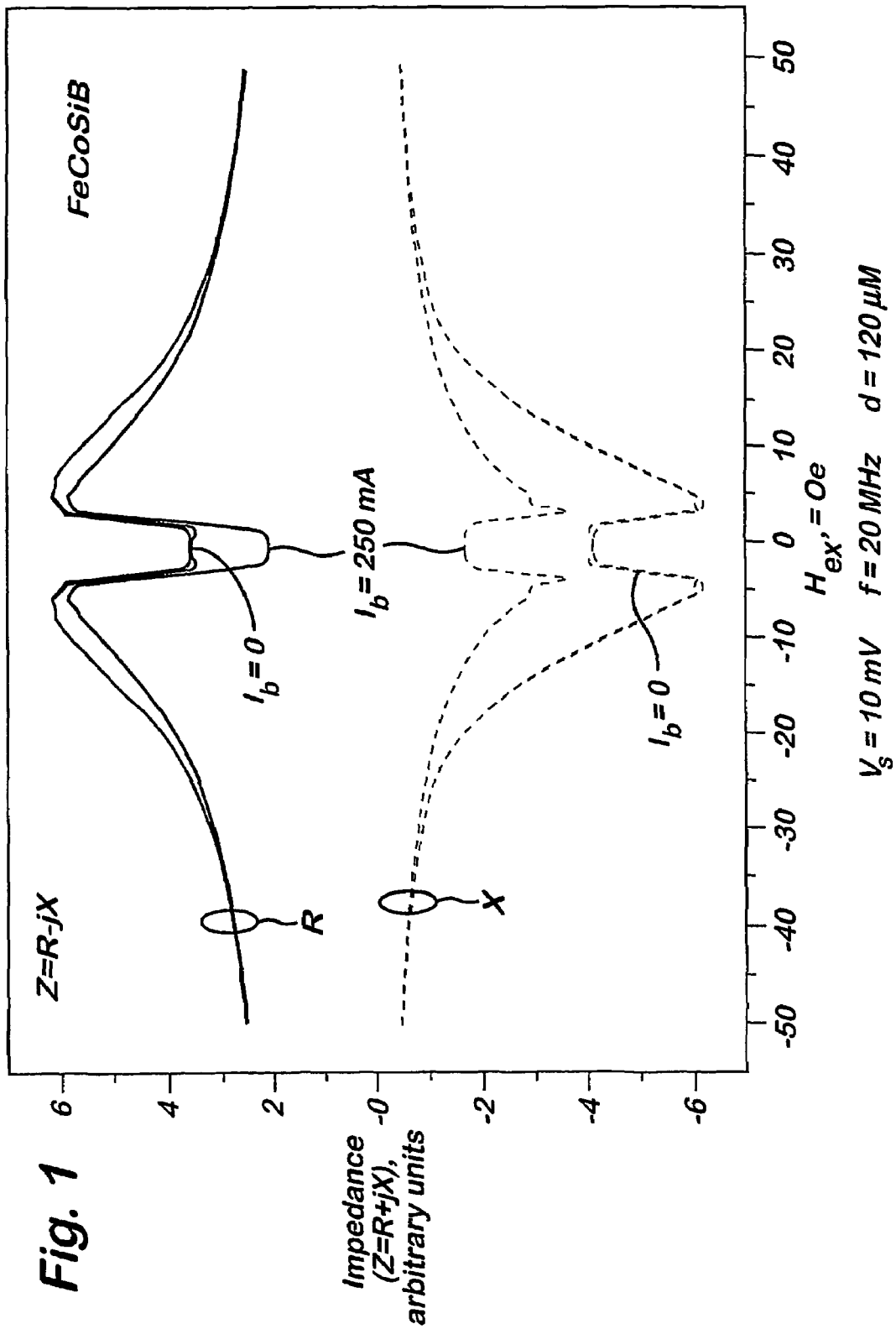
FIG. 1 depicts a graph representing the magneto-impedance characteristics of CoFeSiB amorphous wire having a diameter of 120 microns and length of 3 cm.

FIG. 1 represents the impedance of a 3 cm long amorphous wire of CoFeSiB. The wire has a diameter of 120 microns. The measurements of the resistive R and inductive X components of the impedance were made at a frequency of 20 MHz.

The magnitude of the reactive component X is given by;

$$X = \omega L \quad (1)$$

were L is inductance of the wire and $\omega$ is the angular frequency of the input signal.

Two measurements were performed, a first in which no DC current was applied (represented on the graphs by the lines labelled $I_b=0$) and the second in which a bias current of 250 mA DC was applied, represented by the lines labelled $I_b=250$ mA. In each case an AC signal having a peak to peak voltage of 10 mV was applied.

Looking at the results for the real part of the impedance, it will be noted that at small fields, where the magnitude of the field is between 0 and 2 Oersteds (1 amp meter$^{-1}$=4$\pi$×10$^{-3}$ Oersted) the resistance is relatively low and unchanging. The field strengths between 2 and 4 Oersted the impedance rises rapidly. For field strengths between 5 and 10 Oersted the impedance only rises slightly and then for field strengths having a magnitude greater than 10 Oersted the resistance asymptotes towards a low value. The response is similar when the wire is biased by a current of 250 mA, although the resistance in the presence of no applied magnetic field is lower.

Turning to the reactive part of the impedance, this shows a similar response. For applied fields having an intensity of between 0 to 2 Oersted, the reactance of the wire remains approximately constant. The inductance of the wire then rises steeply in the presence of fields in the range of 2 to 4 Oersted, peaking at about 4 Oersted. Further increases in field strength result in the inductance of the wire asymptoting towards a relatively low value. It is also to be noted that the inductance of the wire in the presence of no applied magnetic field but with the bias current of 250 mA is much less than that of the wire when no external DC bias is applied. Nevertheless, it is clear that the sensor can exhibit rapid changes in its electrical characteristics for a minor change in the intensity of the external field.

Figure 2:
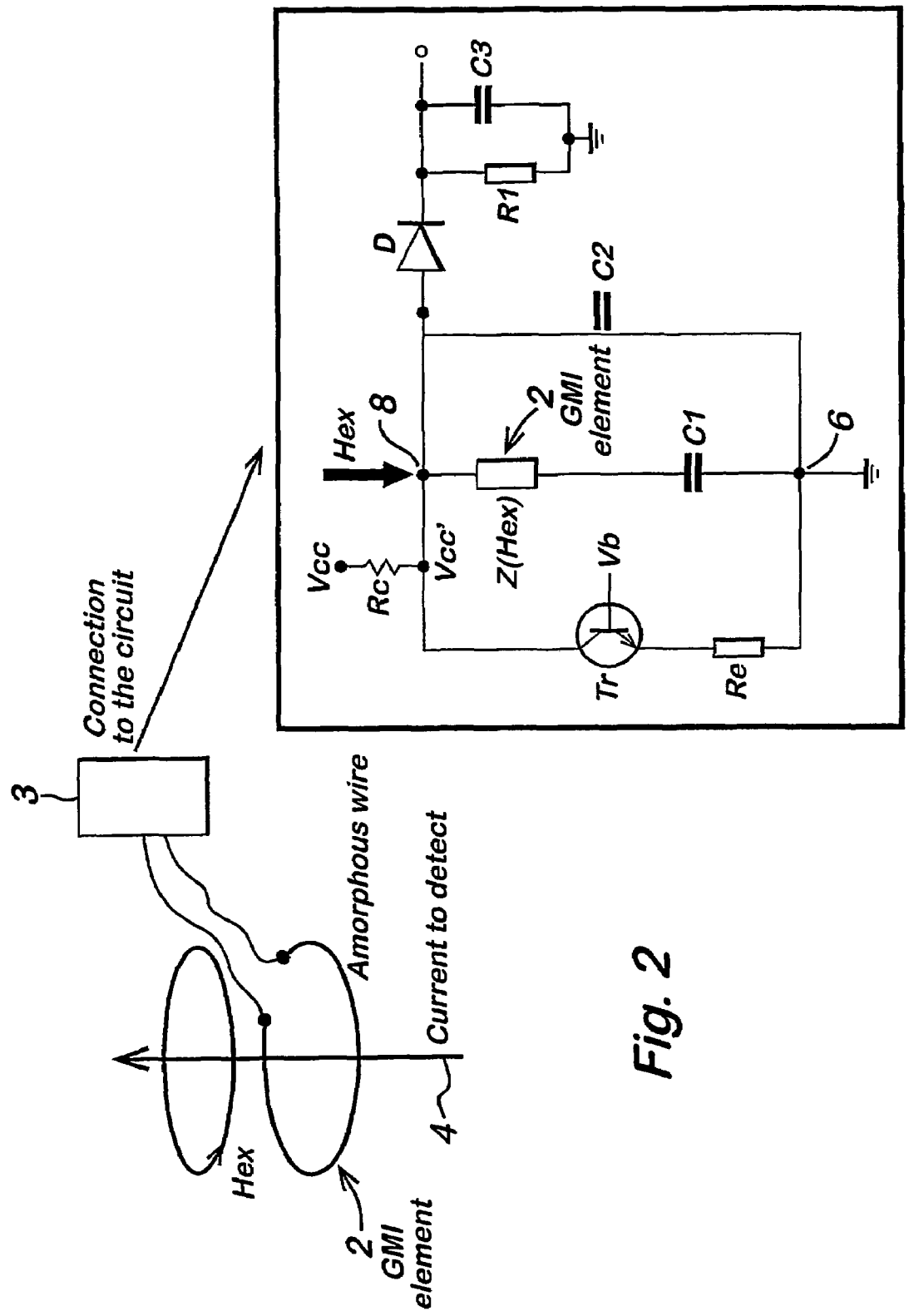
FIG. 2 illustrates a sensor and measurement apparatus constituting an embodiment of the present invention and which includes an inset diagram of a Colpitt's oscillator.

FIG. 2 schematically illustrates a sensor and measurement circuit constituting an embodiment of the present invention. A single turn of wire 2 exhibiting magneto-impedance encircles a circuit carrying wire or wires 4 which generates a magnetic field by virtue of the current flow therein. The sensor wire 2 is in series with a first capacitor C1 and the combination of the sensor wire 2 and the capacitor C1 is shunted by capacitor C2. The node 6 between capacitor C1 and C2 is connected to ground and is also connected to the emitter of a transistor Tr via a resistance Re (which may be the intrinsic emitter resistance of the transistor itself). The collector of the transistor Tr is connected to the node 8 where C2 connects to the sensor wire 2. A positive voltage Vcc is applied to this node 8 via a resistor Rc, and an anode of a diode D is also connected to node 8. The cathode of the diode D is filtered by a circuit comprising resistor R1 and C3 in parallel. R1 and C3 act in combination with the diode D such that C3 becomes charged by current passing through the diode and is slowly discharged by a leak path through R1.

The transistor is biased into operation by voltage Vb applied to its base, from a biasing circuit (not shown for simplicity). The ratio of resistors Rc and Re are selected so as to bring the circuit into oscillation when the in-phase impedance of the sensor is not too high. However, the gain is also selected so that the increase in the resistance of the sensor 2 due to the presence of a magnetic field or a change in oscillation frequency due to a change in the inductance of the sensor can cause the oscillations to cease.

Figure 3:
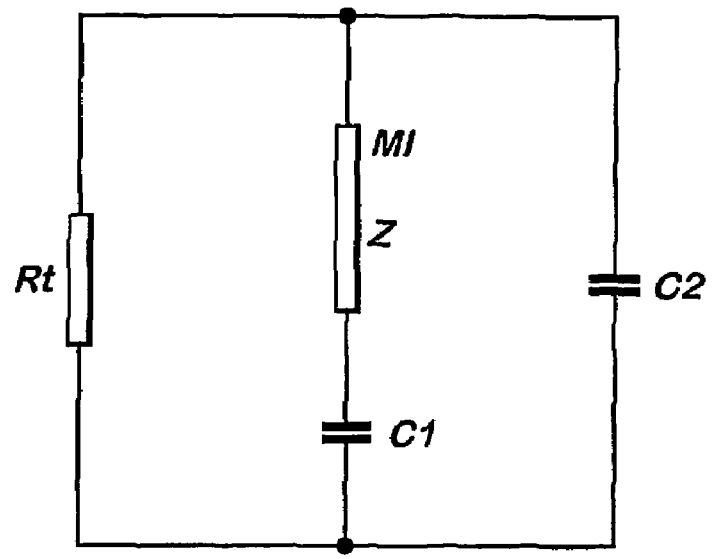
FIG. 3 depicts an equivalent circuit of a Colpitt's oscillator.

FIG. 3 is an equivalent circuit for the arrangement shown in FIG. 2. $R_t$ is the internal resistance of the transistor ($R_t$ e$\tau$R$_e$).

For the circuit, the resonance frequency $\omega_{res}$ is given by:

$$\omega_{res}^2 = \left(\frac{1}{C1} + \left(\frac{R(Hex)}{Rt} + 1\right)\frac{1}{C}\right)\frac{1}{L(Hex)} \quad (2)$$

Typically, Rt is very much greater than R and therefore the oscillation frequency is proportional to $(L(H_{ex}))^{-1/2}$ where $R(H_{ex})$ is the resistance of the sensor.

Figure 4:
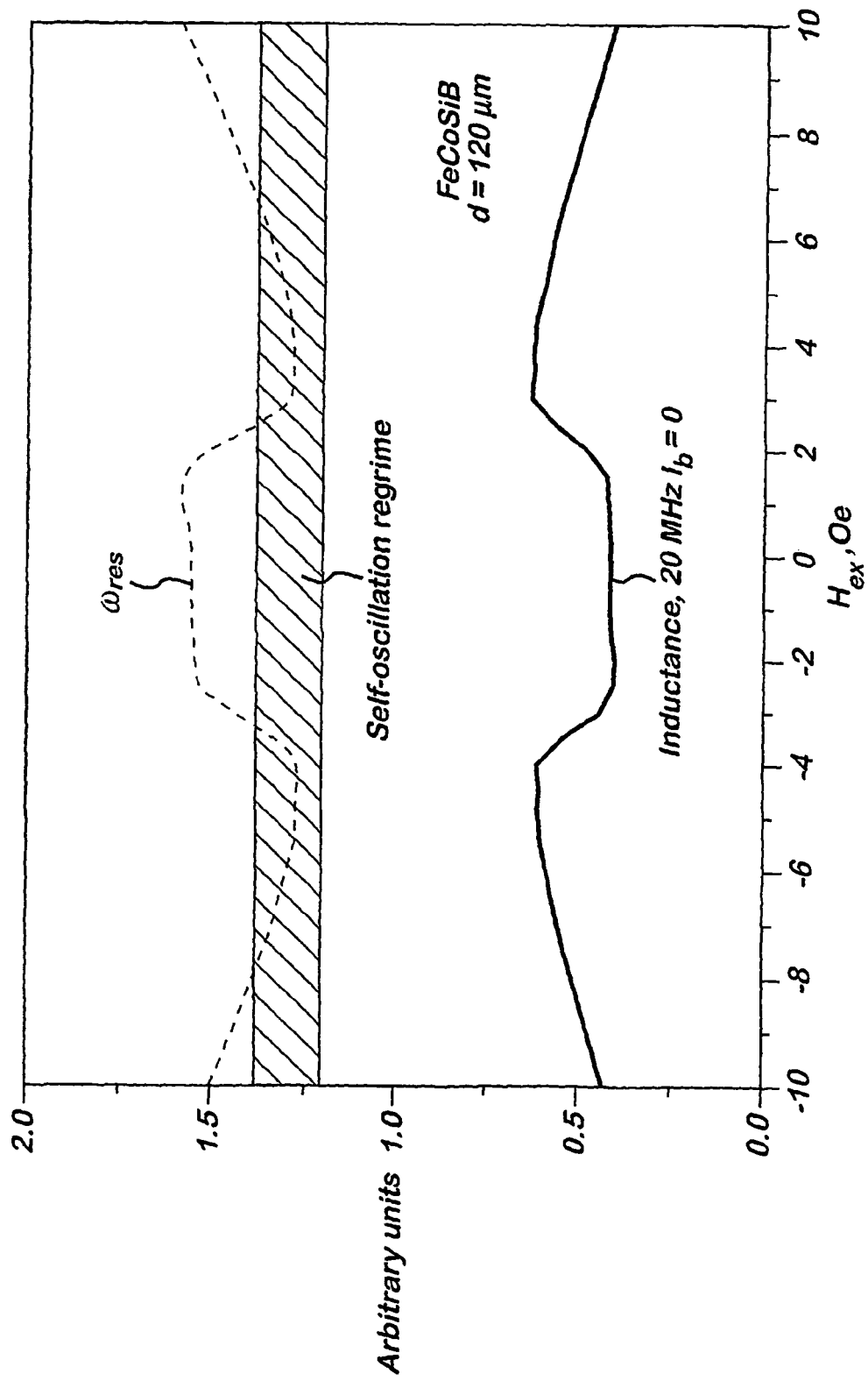
FIG. 4 depicts a graph representing the expected behaviour of the oscillator (ignoring any resistance change) shown in FIG. 2.

FIG. 4 shows the expected behaviour of the oscillation frequency $\omega_{res}(H_{ex})$ which is calculated using the field dependence over the inductance L. If the circuit has a narrow frequency band corresponding to the self oscillation regime, it can be forced to oscillate by changing the magnetic field around the sensor. Thus in this instance, the circuit is sensitive, and goes into oscillation for field strengths having a magnitude of 2.5 to 6.5 Oersted.

Figure 5:
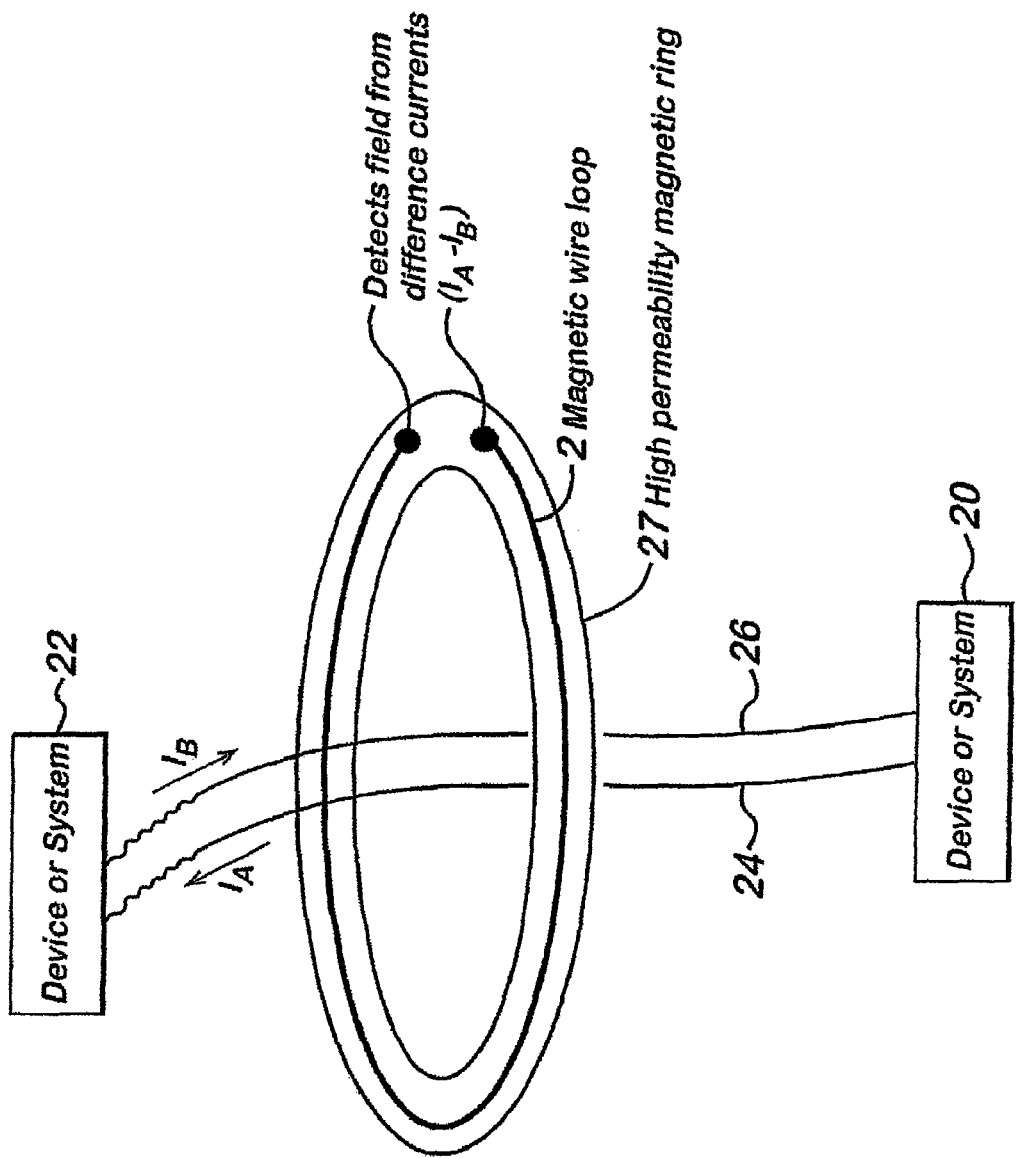
FIG. 5 schematically illustrates a safety device constituting an embodiment of the present invention.

FIG. 5 schematically illustrates the use of a circuit of the type shown in FIG. 2 in order to monitor the current flow from an electrical supply 20 to a device 22. The current to and from the device 22 is carried by two wires 24 and 26 which should carry equal currents in anti phase. Thus, if the wires are close to one another, then the magnetic fields generated by each wire should substantially cancel at reasonable distance from the surface of the wires 24 and 26. Thus, the sensor loop becomes sensitive to the current difference, $I_A-I_B$ between the currents carried in the wires. This is useful to detect if a failure has occurred in the device 22 such that a new current return path is established. This could, for instance, be because a wire has severed or a person is being electrocuted. Under such circumstances, the current difference $I_A-I_B$ becomes non-zero and this can be detected by the sensor 2, thereby causing the oscillator to start oscillating which results in a voltage change across capacitor C3. The change in oscillator behaviour can then be detected by a further circuit (not shown) and used to take appropriate action, for example to operate a relay or similar to halt the supply of power from the electrical supply 20 to the load 22.

The sensor loop may be placed on a soft magnetic element which forms a closed path, such as a ring (or between rings) which can act to detect the magnetic field resulting from a difference in the currents. The ring 27 can also help to screen the sensor from external interference fields. Packing elements, such as washers may be provided adjacent the ring 27 in order to better define the relative positions of the wires 24, 26 and the ring 27 and sensor wire 2. Thus the packing elements may hold the wires 26 towards the axis on the ring 27 or symmetrically disposed about the axis.

Figure 6:
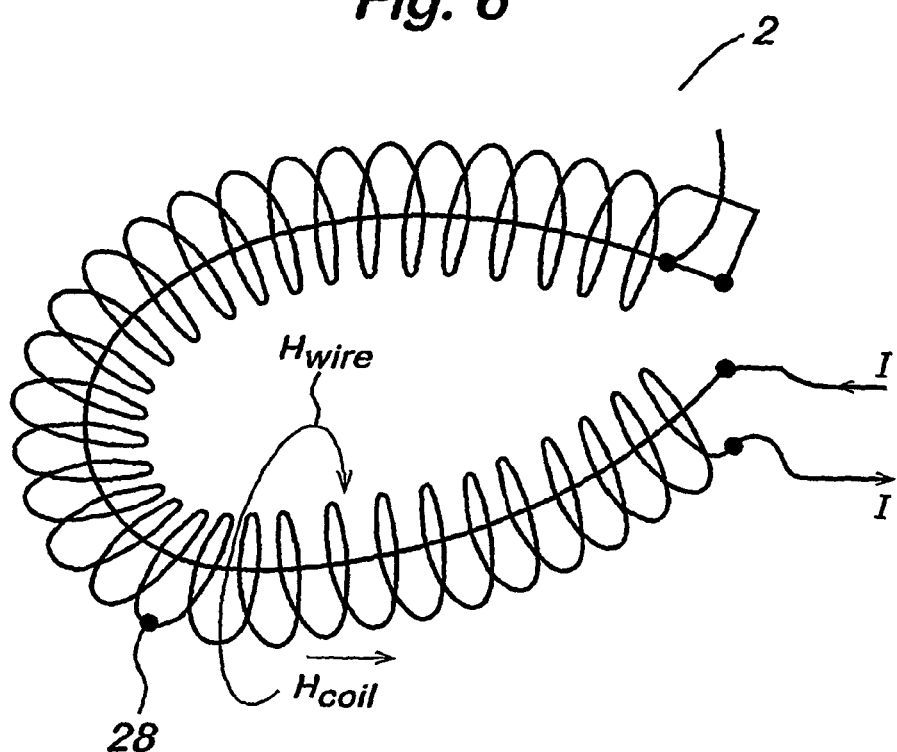
FIG. 6 illustrates a biasing arrangement incorporated into the sensor.
Figure 7:
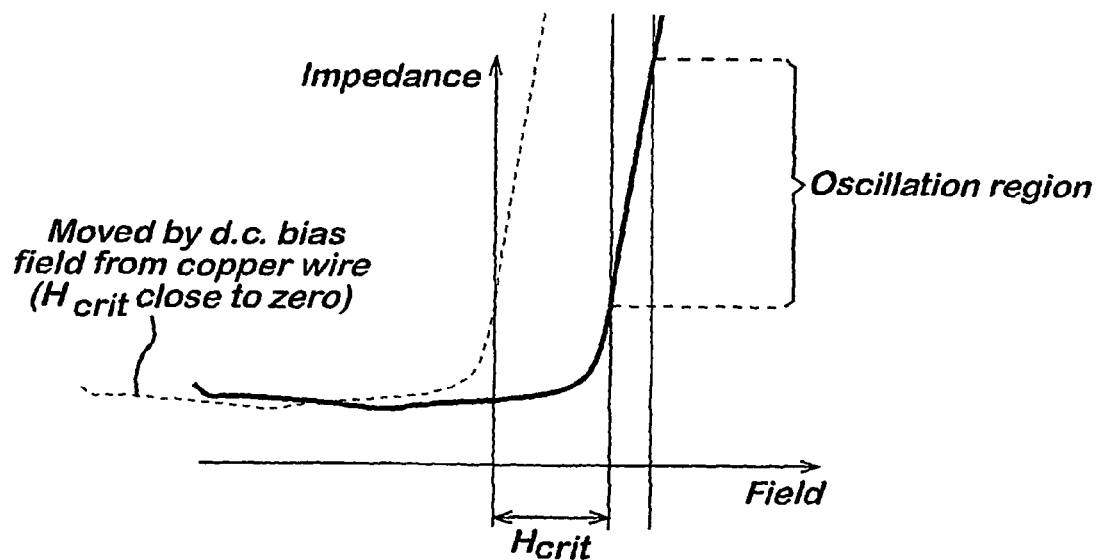
FIG. 7 schematically illustrates the result of the biasing arrangement on the performance of the oscillator shown in FIG. 2.
Figure 8:
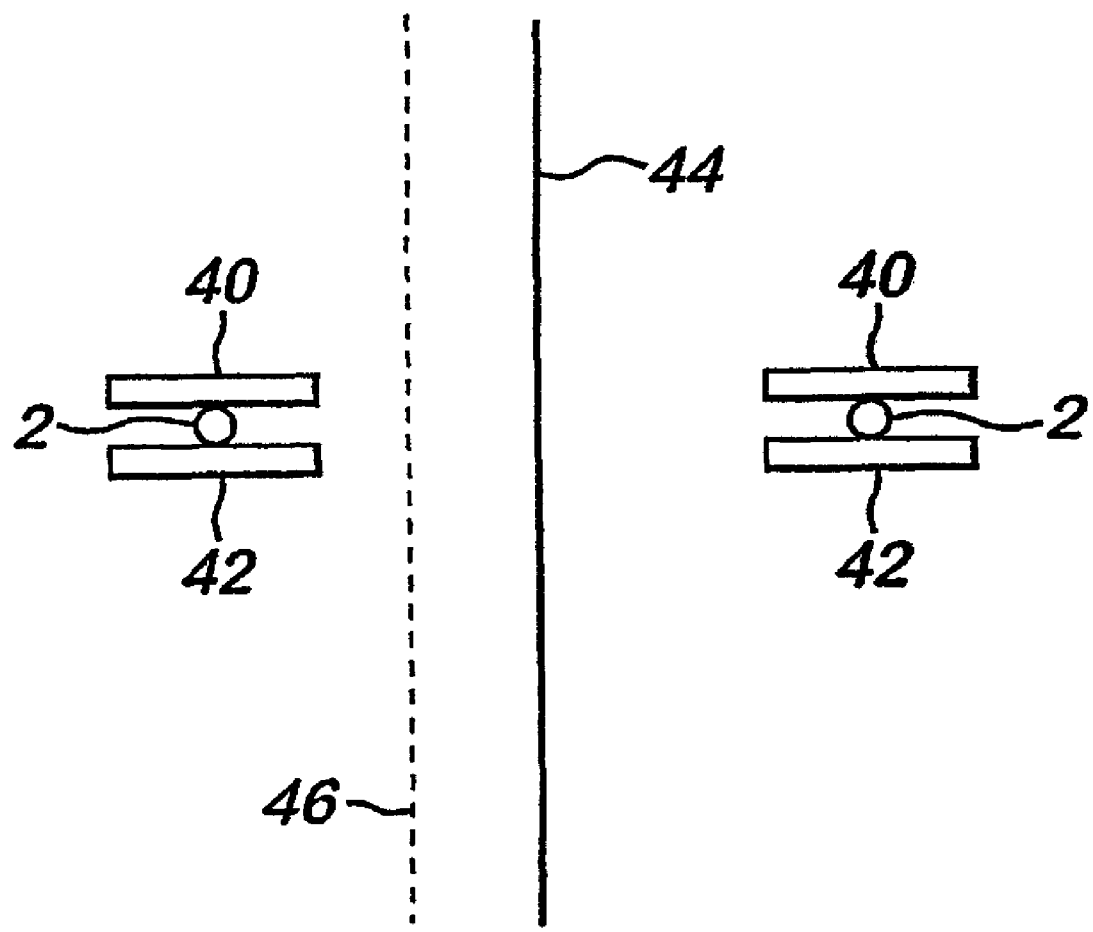

FIG. 6 schematically illustrates how a biasing arrangement may be provided at the sensor. The sensor wire 2 is over-wound by another wire such as copper wire 28 such that on AC bias current can be used to superimpose a bias magnetic field along the axis of the sensor 2. This has the effect, as shown in FIG. 7, of moving the onset of oscillation, as defined by magnetic field strength $H_{crit}$, from its normal value which was 2.5 Oersted in the examples hereinbefore to a new value which is closer to zero. The coil can be connected in series with the sensor.

Figure 8:
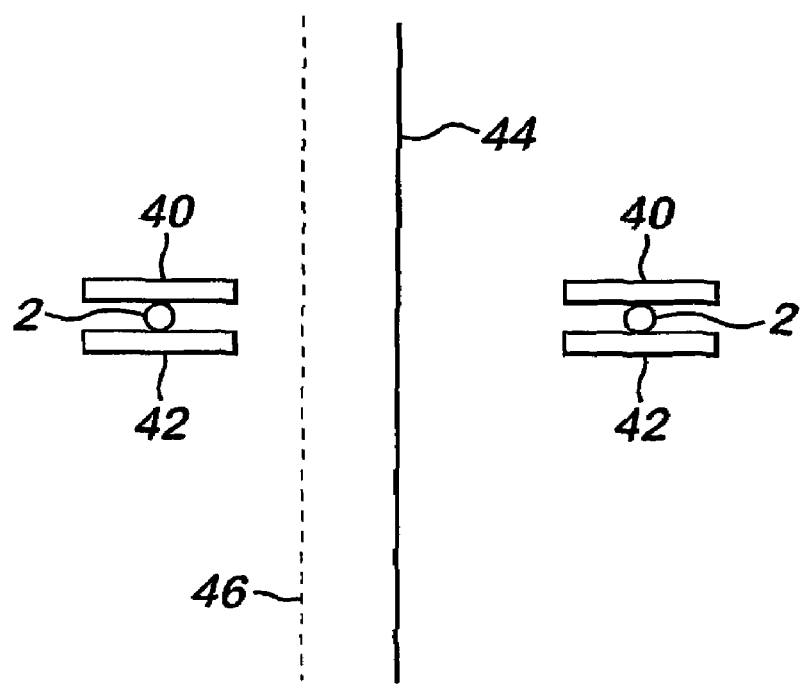
FIG. 8 schematically illustrates a sensor element in association with a pair of magnetic rings that are shown in cross-section.

FIG. 8 schematically illustrates the magnetic sensor head in greater detail for an arrangement of wire 2, magnetic elements 40 and 42, where the loop of magnetic wire 2 is sandwiched between rings of magnetic elements 40 and 42 which encircle one or more current carrying conductors, schematically represented by conductor 44. The rings 40 and 42 may be made of a magnetically soft material, such as a soft iron or a ferrite such that they exhibit relatively high permeability but do not necessarily become permanently magnetized. However, permanently magnetized rings may be used in order to provide a magnetic bias to the sensor. As shown, the rings are located either side of the wire 2, and serve to shield the wire 2 from external magnetic fields. However, the rings also perform the important function of making the sensor insensitive to the position of the wire 44 with respect to the wire 2. As shown in FIG. 8, the wire 44 is coaxial with the sensor wire 2. However in practice, the wire may become displaced to a new position which is schematically represented by chain line 46. If the rings 40 and 42 were not present, this displacement for wire 44 to new position 46 would cause a change in the output of the sensor. However, with the presence of one ring 40 or both rings 40 and 42 the displacement of the wire 44 to a new position 46 does not result in a change in the output of the sensor. This makes practical current measurements of the current flowing in one or more conductors, or the out of balance currents flowing in one or more conductors, much more feasible with this configuration.

Where, as shown in FIG. 6, the magnetic bias is provided by an over wound wire 28, this wire can be wound over the elements 40 and 42.

It is thus possible to provide a magnetic field sensor having a switched type response output and which also can have its response tailored by the application of a bias field. As shown herein, the sensor can be used to measure the magnetic field around a conductor resulting from current flow therein, and hence to infer the current flow within the conductor, or where a plurality of conductors are provided, to sum the contributions from the individual fields.

Additional objects, advantages and novel features of the invention as set forth in the description that follows, will be apparent to one skilled in the art after reading the foregoing detailed description or may be learned by practice of the invention. The objects and advantages of the invention may be realized and attained by means of the instruments and combinations particularly pointed out here.

What is claimed is:

1. A magnetic field detector comprising:
   a sensor exhibiting giant magneto-impedance (GMI), the sensor being arranged in a substantially closed path and arranged to encircle a current carrying wire; and
   a measurement device responsive to the impedance of the sensor, wherein the sensor is positioned on a first magnetic element in the form of a ring arranged to encircle the current carrying wire, wherein the magnetic element is magnetically coupled with the sensor to a level that the sensor is substantially insensitive to the position of the current carrying wire with respect to the sensor.

2. The magnetic field detector of claim 1, wherein the sensor is provided with a magnetic biasing element.

3. The magnetic field detector of claim 2, wherein the magnetic biasing element includes a coil that over winds the sensor, and wherein the coil is connected in series with the sensor.

4. The magnetic field detector of claim 3, wherein the coil and sensor, in use, carry an alternating bias current.

5. The magnetic field detector of claim 1, wherein the measurement device is arranged to undergo a transition between first and second operating states as a result of a magnetic field at the sensor changing from a first predetermined range of magnetic field strengths to a second predetermined range of field strengths.

6. The magnetic field detector of claim 1, wherein the measurement device is an oscillator that oscillates as a function of a magnetic field strength at the sensor.

7. The magnetic field detector of claim 1, wherein a plurality of current carrying wires pass through the closed path formed by the sensor, and wherein the magnetic field detector is responsive to a current difference in the plurality of current carrying wires.

8. The magnetic field detector of claim 1, further comprising a second magnetic element in the form of a ring, the first and a second ring being disposed on either side of the sensor.

* * * * *